United States Patent

Schwalm et al.

[11] Patent Number: 5,846,689
[45] Date of Patent: Dec. 8, 1998

[54] POSITIVE-WORKING RADIATION-SENSITIVE MIXTURE AND PRODUCTION OF RELIEF STRUCTURES

[75] Inventors: Reinhold Schwalm, Wachenheim; Dirk Funhoff, Weinheim; Horst Binder, Lampertheim, all of Germany

[73] Assignee: BASF Aktiengesellschaft, Ludwigshafen, Germany

[21] Appl. No.: 708,818

[22] Filed: Sep. 9, 1996

[30] Foreign Application Priority Data

Sep. 11, 1995 [DE] Germany .................. 195 33 607.0

[51] Int. Cl.$^6$ .................................................. G03F 7/039
[52] U.S. Cl. ...................... 430/270.1; 430/326; 430/330; 430/905; 522/25; 522/27
[58] Field of Search ................... 430/270.1, 326, 430/330, 905; 522/25, 27, 31

[56] References Cited

U.S. PATENT DOCUMENTS

| | | | |
|---|---|---|---|
| 3,915,706 | 10/1975 | Limburg et al. | 96/27 |
| 3,923,514 | 12/1975 | Marsh | 96/35 |
| 4,678,737 | 7/1987 | Schneller et al. | 430/270 |
| 5,141,969 | 8/1992 | Saeva et al. | 430/270.1 |
| 5,191,124 | 3/1993 | Schwalm et al. | 430/270.1 |
| 5,318,876 | 6/1994 | Schwalm et al. | 430/270.1 |
| 5,525,453 | 6/1996 | Pryzbilla et al. | 430/270.1 |
| 5,605,781 | 2/1997 | Gerlorme et al. | 430/270.1 |
| 5,635,332 | 6/1997 | Nakano et al. | 430/270.1 |

FOREIGN PATENT DOCUMENTS

| | | |
|---|---|---|
| 401499 | 12/1990 | European Pat. Off. . |
| 628 876 | 12/1994 | European Pat. Off. . |
| 1103640 | 4/1989 | Japan . |

OTHER PUBLICATIONS

Crivello et al., *J. of Polymer Sci.*, vol. 18, pp. 1021–1034, 1980.

Mack, *Microlithography World*, Spring 1995, pp. 20–21.

*Primary Examiner*—John S. Chu
*Attorney, Agent, or Firm*—Keil & Weinkauf

[57] ABSTRACT

A positive-working radiation-sensitive mixture essentially consists of (a) at least one polymer which contains acid-labile groups and is insoluble in water but becomes soluble in aqueous alkaline solutions as a result of the action of acid, (b) at least one organic compound which produces an acid under the action of actinic radiation and (c) at least one further organic compound differing from (b), where the polymer (a) contains incorporated units of the formulae (I), (II) and (III)

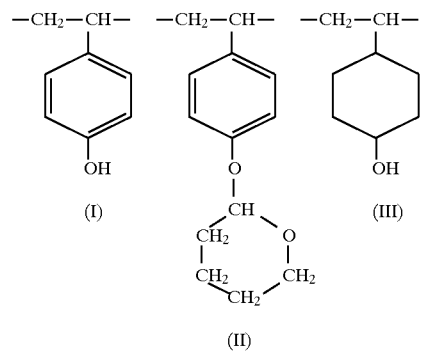

and the organic compound (b) is a sulfonium salt of the formula (IV)

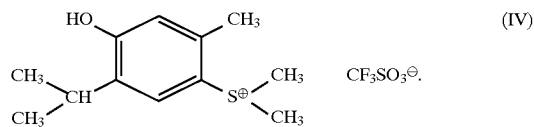

The radiation-sensitive mixture is suitable for the production of relief structures having improved contrast.

7 Claims, No Drawings

POSITIVE-WORKING RADIATION-SENSITIVE MIXTURE AND PRODUCTION OF RELIEF STRUCTURES

Positive-working radiation-sensitive mixture and production of relief structures The present invention relates to positive-working radiation-sensitive mixtures which contain acid-labile groups and photochemically active components, are sensitive to actinic radiation and have improved contrast. These radiation-sensitive mixtures are particularly suitable as resist materials for one-layer resists for the production of relief patterns.

Positive-working radiation-sensitive mixtures which are based on the principle of chemical reinforcement are known per se. A primary photochemical reaction produces a species which, independently of the radiation, then initiates a catalytic secondary reaction and thus dramatically increases the sensitivity. Such systems, which photochemically produce a strong acid which then cleaves acid-labile groups in a secondary reaction, are disclosed, for example, in U.S. Pat. Nos. 3,923,514 and 3,915,706 and DE-A 34 06 927.

The contrast of such resists, ie. the sharpness of the differentiation between unexposed and exposed parts, is an important performance characteristic. Processes for improving the contrast are therefore constantly being sought.

It is an object of the present invention to provide a radiation-sensitive mixture which gives very good photosensitivity, good processing latitude, no loss of layer thickness between the different process steps and relief structures having improved contrast.

We have found that this object is achieved, surprisingly, by the novel positive-working radiation-sensitive mixtures.

The present invention relates to positive-working radiation-sensitive mixtures essentially consisting of (a) at least one polymer which contains acid-labile groups and is insoluble in water but becomes soluble in aqueous alkaline solutions as a result of the action of acid, (b) at least one organic compound which produces an acid under the action of actinic radiation and (c) at least one further organic compound differing from (b), wherein
the polymer (a) contains incorporated units of the formulae (I), II) and (III)

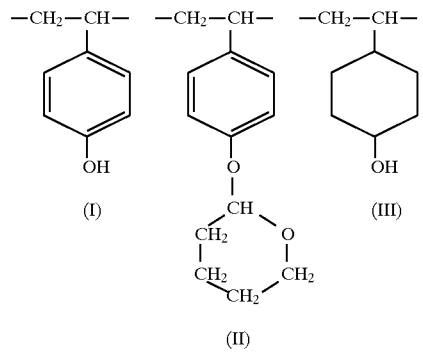

with the proviso that
35–70 mol % of units of the formula (I)
30–50 mol % of units of the formula (II) and
0–15 mol % of units of the formula (III) are present as structural units of the polymer, the organic compound (b) is a sulfonium salt of the formula (IV)

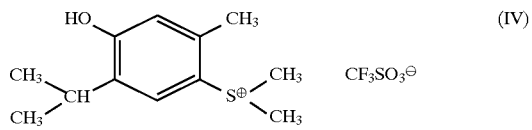

and the organic compound (c) is of the formula (V)

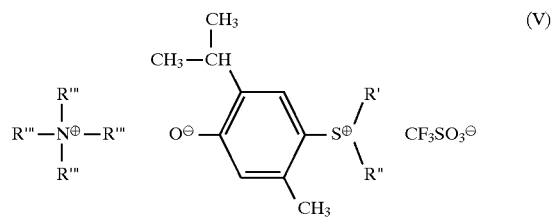

where R' and R" are identical or different and are each alkyl of 1 to 4 carbon atoms, or R' and R" are linked to one another via $CH_2$ groups to give a five-membered ring, and R'" is alkyl of 1 to 4 carbon atoms.

In the formula (V) of the organic compound (c), R', R" and R'" are each preferably $CH_3$.

The novel mixtures are preferably present in the form of a solution in an organic solvent or solvent mixture. It is also preferable if the components (a), (b) and (c) are used in amounts of from 90 to 97.99 percent by weight of (a),
from 2 to 8 percent by weight of (b) and
from 0.01 to 2 percent by weight of (c), in each case based on the total mixture (a)+(b)+(c).

The present invention furthermore relates to a process for the preparation of photosensitive coating materials, novel radiation-sensitive mixtures being used.

The present invention relates in particular to a process for the production of relief structures by application of a radiation-sensitive mixture in a layer thickness of from 0.1 to 5 μm to a substrate pretreated in a conventional manner, drying at from 70° to 150° C., imagewise exposure to actinic light, if required heating to 40°–160° C., and development with an aqueous alkaline solution, wherein radiation-sensitive mixtures according to the present invention are used.

The novel radiation-sensitive mixtures are distinguished by low absorption of UV radiation and therefore give steep sidewalls in the relief and have very good photosensitivity (about 30 mj/cm²), so that they are very suitable for processing in deep UV steppers. Further very important advantages are that contrast and depth of focus are improved, so that structures of 0.25 μm can be reproducibly produced even with fluctuations in layer thickness.

The very good processing latitude of the exposed wafers is particularly advantageous, so that said wafers can be reproducibly structured even one hour after their exposure and no loss of layer thickness occurs between the various process steps, such as heating and development.

Regarding the components of the novel radiation-sensitive mixtures, the following may be stated specifically.

The polymers (a) to be used according to the invention have in general molecular weights ($\overline{M}_w$) of from 2000 to 100,000, preferably from 4000 to 30,000 and can be prepared, for example, from poly(p-hydroxystyrene) or, preferably, poly(p-hydroxystyrene) additionally containing nonaromatic cyclic alcohol units (vinylcyclohexan-4-ol units) in amounts of up to 15 mol %, for example by polymer-analogous reaction with corresponding amounts of tetrahydropyran in the presence of acid. An appropriate process is described in EP-342 498-B (DE-A-3 817 012).

Examples of suitable starting materials for the preparation of the polymers (a) to be used according to the invention are also those partly hydrogenated poly(p-hydroxystyrenes) disclosed in J 01 103 604-A and EP-A-0 401 499.

The polymer (a) contains the units of the formulae (I), (II) and (III) in amounts of 35–70 mol % of units of the formula (I), 30–50 mol % of units of the formula (II) and 0–15 mol % of units of the formula (III).

If the polymer (a) contains no units of the formula (III), preferably 50±70 mol % of units of the formula (I) and 30±50 mol % of units of the formula (II) are incorporated as structural units.

However, the polymer (a) particularly preferably contains units of the formula (III) in amounts of up to from 2 to 15, preferably from 6 to 14, mol %, based on the total amount of the structural units of the formulae (I), (II) and (III) in mol %, incorporated as structural units. In this case, the polymer (a) contains incorporated in general 37–60, in particular 38–58, mol % of the structural units of the formula (I) and 38–48 mol % of the structural units of the formula (II).

Component (a) is present in the novel radiation-sensitive mixture in general in amounts of from 90 to 97.99, preferably from 93 to 96, percent by weight, based on the total amount of the components (a)+(b)+(c).

According to the invention, a sulfonium salt of the formula (IV) is used as organic compound (b) which produces an acid under the action of actinic radiation. The preparation of the sulfonium salts forms part of the prior art. It can be effected, for example, by a synthesis method described in J. Polym. Sci., Chem. Ed. 18 (1980), 1021. The organic compound (b) is present in the novel radiation-sensitive mixture in general in an amount of from 2 to 8, preferably from 3 to 6, percent by weight, based on the total amount of the components (a)+(b)+(c).

The organic compound to be used according to the invention as component (c) is of the formula (V), where R', R" and R'" are identical or different and are each alkyl of 1 to 4 carbon atoms, eg. methyl, ethyl, propyl, isopropyl, n-butyl or isobutyl, or R' is linked to R" via $CH_2$ groups to form a five-membered ring. R', R" and R'" are each preferably $CH_3$.

The preparation of such compounds (c) can be carried out, for example, by reacting a 2-methyl-4-hydroxy-5-isopropylphenyldialkylsulfonium triflate with about equimolar amounts of tetramethylammonium hydroxide, for example in the presence of an inert solvent, such as an alkanol.

Component (c) is present in the novel radiation-sensitive mixture in general in amounts of from 0.01 to 2, preferably from 0.05 to 1, percent by weight, based on the total amount of the components (a)+(b)+(c).

The novel radiation-sensitive mixture may additionally contain further conventional assistants and additives (sensitizers, colorants, leveling agents, wetting agents, stabilizers, etc.) corresponding to the prior art. These additives are added in general in amounts of less than 3% by weight, based on the total amount of the components (a)+(b)+(c).

For the production of resists, the novel mixtures are preferably dissolved in a suitable inert polar organic solvent, the solids content usually being from 5 to 40% by weight. Suitable solvents are in principle aliphatic ketones, alcohols, ethers and esters and mixtures thereof. Alkylene glycol monoalkyl ethers, such as ethylcellosolve, butyl glycol, methylcellosolve and 1-methoxy-2-propanol, alkylene glycol alkyl ether esters, for example methylcellosolve acetate, methylpropylene glycol acetate and ethylpropylene glycol acetate, ketones, for example cyclohexanone, cyclopentanone and methyl ethyl ketone, and acetates, such as butyl acetate and ethyl acetate, other esters, such as ethyl lactate and butyrolactone, and mixtures thereof with aromatics, such as toluene and xylene are particularly preferred. The choice of the appropriate solvents and mixtures thereof depends on the solubility of the mixture of the particular components (a)+(b)+(c).

Furthermore, other additives, such as adhesion promoters and plasticizers, may be added, in general in amounts of up to 1% by weight.

The novel radiation-sensitive mixtures are sensitive to X-rays, electron radiation and UV radiation. If necessary, small amounts of sensitizers may be added, for example pyrene and perylene, in order to sensitize the compounds in the relatively long-wave UV range up to the visible wavelength range. For exposure in specific wavelength ranges, for example to short-wave UV (<300 nm), high transparency of the layers at the particular exposure wavelength is required. In conventional exposure units based on mercury lamps, the 254 nm line is used or excimer lasers which emit at 248 nm (KrF) are employed. Radiation-sensitive recording materials should therefore have very low optical densities in this range.

In the novel process for the preparation of photosensitive coating materials and for the production of positive relief patterns, a radiation-sensitive recording layer which consists essentially of the novel radiation-sensitive mixture is exposed imagewise to a dose such that, after a postbake step at from 40° to 160° C. in aqueous alkaline solvents, the solubility of the exposed parts increases and these parts can be selectively removed by means of the alkaline developer.

The photoresist solutions containing the novel radiation-sensitive mixture are generally applied in layer thicknesses of from 0.1 to 5 $\mu$m, preferably from 0.5 to 1.5 $\mu$m, to suitable substrates, for example surface-oxidized silicon wafers, by spin coating and are dried (for example at from 70° to 150° C.) and exposed imagewise to a suitable light source through a photomask, for example to short-wave UV radiation (deep UV) having wavelengths of from 200 to 300 nm. Particularly suitable light sources are KrF excimer lasers (248 nm). After the imagewise exposure, if required after a brief postbake at up to 160° C., development is effected with conventional aqueous alkaline developer solutions, in general at a pH of from 12 to 14, the exposed parts being washed out. The resolution is in the submicron range. The exposure energy required for the novel radiation-sensitive mixtures is in general from 10 to 300 mJ/cm$^2$ at layer thicknesses of 1 $\mu$m.

The novel radiation-sensitive mixtures are distinguished by high sensitivity, good resolution, improved contrast, improved depth of focus and greater processing latitude and are therefore particularly advantageous for lithography in the short-wave range.

In the examples and comparative examples which follow, parts and percentages are by weight, unless stated otherwise.

The depth of focus was determined by a method similar to that described by Chris A. Mack in Microlithography World, Spring 1995, pages 20 to 21, U.S.A.

The contrast of the resist, expressed by means of the gamma value ($\Gamma$p), was determined from a plot of layer thickness against exposure dose. For positive resist systems, the gamma value is defined as $$\Gamma_p = \left[ \log \frac{D_1}{D_0} \right]^{-1}$$

where $D_0$ and $D_1$ are the extrapolated exposure energy doses from the dark decay energy curve.

Comparative Example 1

A photoresist solution was prepared from 5 parts of 2-methyl-4-hydroxy-5-isopropylphenyldimethylsulfonium triflate and 95 parts of poly[4-hydroxystyrene-co-4-tetrahydropyranyloxystyrene-co-vinyl-cyclohexan-4-ol] (molar ratio of the comonomers=49:45:6) and 400 parts of ethyl lactate. After the starting materials had been dissolved, the solution was filtered through a filter having a pore diameter of 0.2 μm.

A layer, about 0.8 μm thick, of the solution was applied by spin coating to surface-oxidized silicon wafers and postbaking was carried out for 1 minute at 130° C. After exposure to excimer laser light of wavelength 248 nm through a structured test mask, the wafer was postbaked at 130° C. for 1 minute and then developed with an aqueous alkaline developer for 1 minute.

After measurement of the remaining photoresist layers, the contrast of the resist was determined. A gamma value of 6 was obtained.

EXAMPLE 1

A photoresist solution was prepared from 5 parts of 2-methyl-4-hydroxy-5-isopropylphenyldimethylsulfonium triflate, 0.1 part of the organic compound (c) of the formula (V) where R', R" and R'" are each methyl and 95 parts of poly[4-hydroxystyrene-co-4-tetrahydropyranyloxystyrene-co-vinyl-cyclohexan-4-ol] (molar ratio of the comonomers= 49:45:6) and 400 parts of ethyl lactate. After the starting materials had been dissolved, the solution was filtered through a filter having a pore diameter of 0.2 μm and was processed similarly to Comparative Example 1. The gamma value found for this solution was 8.

Comparative Example 2

A photoresist solution was prepared from 5 parts of 2-methyl-4-hydroxy-5-isopropylphenyldimethylsulfonium triflate and 95 parts of poly[4-hydroxystyrene-co-4-tetrahydropyranyloxystyrene-co-vinyl-cyclohexan-4-ol] (molar ratio of the comonomers=52:40:8) and 400 parts of ethyl lactate. After the starting materials had been dissolved, the solution was filtered through a filter having a pore diameter of 0.2 μm.

After processing according to Example 1, a gamma value of 6.5 was determined experimentally.

EXAMPLE 2

A photoresist solution was prepared from 5 parts of 2-methyl-4-hydroxy-5-isopropylphenyldimethylsulfonium triflate, 0.1 part of the organic compound (c) of the formula (V) where R', R" and R'" are each methyl and 95 parts of poly[4-hydroxystyrene-co-4-tetrahydropyranyloxystyrene-co-vinyl-cyclohexan-4-ol] (molar ratio of the comonomers= 52:40:8) and 400 parts of ethyl lactate. After processing according to Example 1, a gamma value of 9 was determined experimentally.

Comparative Example 3

A photoresist solution was prepared from 6 parts of 2-methyl-4-hydroxy-5-isopropylphenyldimethylsulfonium triflate and 94 parts of poly[4-hydroxystyrene-co-4-tetrahydropyranyloxystyrene-co-vinyl-cyclohexan-4-ol] (molar ratio of the comonomers=47:40:13) and 400 parts of ethyl lactate. After the starting materials had been dissolved, the solution was filtered through a filter having a pore diameter of 0.2 μm.

After processing according to Example 1, a gamma value of 6.5 was determined experimentally.

EXAMPLE 3

A photoresist solution was prepared from 6 parts of 2-methyl-4-hydroxy-5-isopropylphenyldimethylsulfonium triflate, 0.1 part of the organic compound (c) of the formula (V) where R', R" and R'" are each methyl and 94 parts of poly[4-hydroxystyrene-co-4-tetrahydropyranyloxystyrene-co-vinyl-cyclohexan-4-ol] (molar ratio of the comonomers= 47:40:13) and 400 parts of ethyl lactate. After processing according to Example 1, a gamma value of 10 was determined experimentally.

Comparative Example 4

A photoresist solution was prepared from 5 parts of 2-methyl-4-hydroxy-5-isopropylphenyldimethylsulfonium triflate and 95 parts of poly[4-hydroxystyrene-co-4-tetrahydropyranyloxystyrene-co-vinyl-cyclohexan-4-ol] (molar ratio of the comonomers=42:45:13) and 345 parts of ethyl lactate. After the starting materials had been dissolved, the solution was filtered through a filter having a pore diameter of 0.2 μm.

A resist layer, about 1 μm thick, of this solution was applied by spin coating to surface-oxidized silicon wafers.

After further processing according to Example 1, a gamma value of 7.5 was determined experimentally.

EXAMPLE 4

A photoresist solution was prepared from 5 parts of 2-methyl-4-hydroxy-5-isopropylphenyldimethylsulfonium triflate, 0.15 part of the organic compound (c) of the formula (V) where R', R" and R'" are each methyl and 95 parts of poly[4-hydroxystyrene-co-4-tetrahydropyranyloxystyrene-co-vinyl-cyclohexan-4-ol] (molar ratio of the comonomers= 42:45:13) and 400 parts of ethyl lactate. After processing according to Example 1, a gamma value of 12 was determined experimentally.

Comparative Example 5

A photoresist solution was prepared from 4 parts of 2-methyl-4-hydroxy-5-isopropylphenyldimethylsulfonium triflate and 96 parts of poly[4-hydroxystyrene-co-4-tetrahydropyranyloxystyrene-co-vinyl-cyclohexan-4-ol] (molar ratio of the comonomers=49:38:13) and 400 parts of ethyl lactate. After the starting materials had been dissolved, the solution was filtered through a filter having a pore diameter of 0.2 μm.

After further processing according to Example 1, a gamma value of 6.4 was determined experimentally.

EXAMPLE 5

A photoresist solution was prepared from 4 parts of 2-methyl-4-hydroxy-5-isopropylphenyldimethylsulfonium triflate, 0.15 part of the organic compound (c) of the formula (V) where R', R" and R'" are each methyl and 96 parts of poly[4-hydroxystyrene-co-4-tetrahydropyranyloxystyrene-co-vinyl-cyclohexan-4-ol] (molar ratio of the comonomers=

49:38:13) and 400 parts of ethyl lactate. After processing according to Example 1, a gamma value of 9 was determined experimentally.

The additions claimed according to the invention in Examples 1, 2, 3, 4 and 5 give rise to better properties of the photoresist investigated.

These improved properties can furthermore be detected in a measurement of the depth of focus.

The addition claimed according to the invention improves the depth of focus, which leads to a greater processing latitude.

EXAMPLE 6

A photoresist solution, prepared according to Example 1, was applied in a layer thickness of 700 nm to a silicon wafer (diameter 200 nm) coated with an antireflecting coating (eg. ARC® CD9 from Brewer Science, Inc. Rolla, Mo., U.S.A.) having a thickness of about 100 nm, and said layer was postbaked at 130° C.

After exposure to a wafer stepper from ASM Lithography with different depths of focus, the wafer was postbaked and was developed with an aqueous alkaline medium in a spray developer.

To determine the depth of focus, the line widths are measured at different focuses. The following results were obtained:

| Focus [μm] | Line width [nm] |
|---|---|
| −0.8 | 404 |
| −0.6 | 327 |
| −0.4 | 332 |
| −0.2 | 338 |
| 0 | 348 |
| 0.2 | 358 |
| 0.4 | 362 |
| 0.6 | 355 |
| 0.8 | 345 |
| 1.0 | 345 |
| 1.2 | 344 |
| 1.4 | 405 |

In contrast, a comparative sample corresponding to Comparative Example 1 without the novel addition of component (c) gave poorer results:

| Focus [μm] | Line width [nm] |
|---|---|
| −0.8 | 497 |
| −0.6 | 371 |
| −0.4 | 341 |
| −0.2 | 345 |
| 0 | 348 |
| 0.2 | 353 |
| 0.4 | 355 |
| 0.6 | 355 |
| 0.8 | 352 |
| 1.0 | 372 |
| 1.2 | 395 |

Comparative Example 7

A further resist formulation comprising 3 parts of 2-methyl-4-hydroxy-5-isopropylphenyldimethylsulfonium triflate and 97 parts of poly[4-hydroxystyrene-co-4-tetrahydropyranyloxystyrene-co-vinyl-cyclohexan-4-ol] (molar ratio of the comonomers=46:45:9) and 400 parts of ethyl lactate was processed according to Example 6. The lines with 250 nm broad structures were measured.

| Focus [μm] | Line width [nm] |
|---|---|
| −0.6 | 200 |
| −0.4 | 231 |
| −0.2 | 231 |
| 0 | 221 |
| 0.2 | 213 |
| 0.4 | not measurable |
| 0.6 | not measurable |

EXAMPLE 7

0.1part of the organic compound (c) of the formula (V) where R', R" and R'" are each methyl was mixed with the resist formulation of Comparative Example 7. This made it possible to obtain substantially better results compared with Comparative Example 7:

| Focus [μm] | Line width [nm] |
|---|---|
| −0.6 | 207 |
| −0.4 | 229 |
| −0.2 | 334 |
| 0 | 238 |
| 0.2 | 235 |
| 0.4 | 225 |
| 0.6 | 226 |
| 0.8 | 352 |

Comparative Example 8

A photoresist solution was prepared from 5 parts of 2-methyl-4-hydroxy-5-isopropylphenyldimethylsulfonium triflate 5 and 95 parts of poly[4-hydroxystyrene-co-4-tetrahydropyranyloxystyrene] (molar ratio of the comonomers=60:40) and 400 parts of ethyl lactate. After the starting materials had been dissolved, the solution was filtered through a filter having a pore diameter of 0.2 μm.

A layer, about 0.8 μm thick, of this solution was applied by spin coating to surface-oxidized silicon wafers and postbaking was carried out for 1 minute at 130° C. After exposure to excimer laser light of wavelength 248 nm through a structured test mask, the wafer was postbaked at 130° C. for 1 minute and then developed with an aqueous alkaline developer for 1 minute.

After measurement of the remaining photoresist layers, the contrast of the resist was determined. A gamma value of 6.4 was found.

EXAMPLE 8

A photoresist solution was prepared from 5 parts of 2-methyl-4-hydroxy-5-isopropylphenyldimethylsulfonium triflate, 0.1 part of the organic compound (c) of the formula (V) where R', R" and R'" are each methyl and 95 parts of poly[4-hydroxystyrene-co-4-tetrahydropyranyloxystyrene] (molar ratio of the comonomers=60:40) and 400 parts of ethyl lactate. After the starting materials had been dissolved, the solution was filtered through a filter having a pore diameter of 0.2 μm and was processed similarly to Example 1. The gamma value was 7.5.

Comparative Example 9

A photoresist solution was prepared from 4 parts of 2-methyl-4-hydroxy-5-isopropylphenyldimethylsulfonium triflate and 96 parts of poly[4-hydroxystyrene-co-4-tetrahydropyranyloxystyrene] (molar ratio of the comonomers=59:41) and 400 parts of ethyl lactate. After the starting materials had been dissolved, the solution was filtered through a filter having a pore diameter of 0.2 μm.

After processing according to Example 1, a gamma value of 6.5 was determined experimentally.

EXAMPLE 9

A photoresist solution was prepared from 4 parts of 2-methyl-4-hydroxy-5-isopropylphenyldimethylsulfonium triflate, 0.1 part of the organic compound (c) of the formula (V) where R', R" and R'" are each methyl and 96 parts of poly[4-hydroxystyrene-co-4-tetrahydropyranyloxystyrene] (molar ratio of the comonomers=59:41) and 400 parts of ethyl lactate. After processing according to Example 1, a gamma value of 8.4 was determined experimentally.

We claim:

1. A positive-working radiation-sensitive mixture essentially consisting of
   (a) at least one polymer which contains acid-labile groups and is insoluble in water but becomes soluble in aqueous alkaline solutions as a result of the action of acid,
   (b) at least one organic compound which produces an acid under the action of actinic radiation and
   (c) at least one further organic compound differing from (b), wherein the polymer (a) contains incorporated units of the formulae (I), (II) and (III)

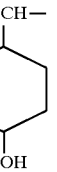

with the proviso that

35–70 mol % of units of the formula (I)

30–50 mol % of units of the formula (II) and

0–15 mol % of units of the formula (III) are present as structural units of the polymer, the organic compound (b) is a sulfonium salt of the formula (IV)

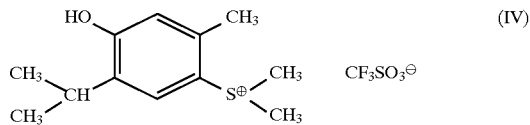

and the organic compound (c) is of the formula (V)

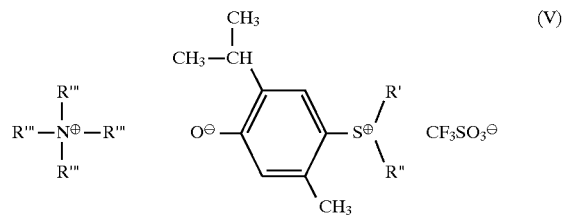

where R' and R" are identical or different and are each alkyl of 1 to 4 carbon atoms, or R' and R" are linked to one another via $CH_2$ groups to give a five-membered ring, and R'" is alkyl of 1 to 4 carbon atoms.

2. A mixture as claimed in claim 1, wherein, in the formula (V) of the organic compound (c), R', R" and R'" are each $CH_3$.

3. A mixture as claimed in claim 1, which is present in the form of a solution in an organic solvent or solvent mixture.

4. A mixture as claimed in claim 1, wherein the components (a), (b) and (c) are used in amounts of
   from 90 to 97.99 percent by weight of (a),
   from 2 to 8 percent by weight of (b) and
   from 0.01 to 2 percent by weight of (c).

5. A process for the preparation of photosensitive coating materials, wherein a radiation-sensitive mixture as claimed in claim 1 is used.

6. A process for the production of relief structures by application of a radiation-sensitive mixture in a layer thickness of from 0.1 to 5 μm to a substrate pretreated in a conventional manner, drying at from 70° to 150° C., imagewise exposure to actinic light, if required heating to 40°–160° C., and development with an aqueous alkaline solution, wherein a radiation-sensitive mixture as claimed in claim 1 to is used.

7. A mixture as claimed in claim 1, wherein the polymer a) contains 37–60 mol % of units of formula (I), 38–48 mol % of units of formula (II) and 2–15 mol % of units of formula (III).

* * * * *